United States Patent [19]

Wada

[11] Patent Number: 5,487,041
[45] Date of Patent: Jan. 23, 1996

[54] SEMICONDUCTOR MEMORY DEVICE WHICH CAN BE PROGRAMMED TO INDICATE DEFECTIVE MEMORY CELL

[75] Inventor: Tomohisa Wada, Hyogo, Japan

[73] Assignee: Mitsubishi Denki Kabushiki Kaisha, Tokyo, Japan

[21] Appl. No.: 309,823

[22] Filed: Sep. 21, 1994

[30] Foreign Application Priority Data

Oct. 25, 1993 [JP] Japan ................... 5-265934

[51] Int. Cl.⁶ ................................................. G11C 13/00
[52] U.S. Cl. .................... 365/200; 365/201; 365/203
[58] Field of Search ................................. 365/200, 201, 365/203

[56] References Cited

U.S. PATENT DOCUMENTS

| | | | |
|---|---|---|---|
| 4,389,715 | 6/1983 | Eaton, Jr. et al. | 365/200 |
| 4,727,516 | 2/1988 | Yoshida et al. | 365/189.05 |
| 5,199,033 | 3/1993 | McGeoch et al. | 365/200 |

FOREIGN PATENT DOCUMENTS 3-30036  2/1991  Japan .
4-175945  6/1992  Japan .

OTHER PUBLICATIONS

"Computer Architecture A Quantitative Approach", Hennessy et al., Morgan Kaufamnn Publishers Inc, pp. 414–415.

"Nonvolatile and Application–Specific Memories", Cho et al., ISSCC Digest of Technical papers, pp. 50–51.

Primary Examiner—Terrell W. Fears
Attorney, Agent, or Firm—Lowe, Price, LeBlanc & Becker

[57] ABSTRACT

A cache memory device includes a plurality of memory cell arrays each including a plurality of memory cell rows, a plurality of first fuse elements each provided corresponding to each memory cell row and disconnected when the corresponding memory cell row is defective, and a plurality of second fuse elements each provided corresponding to each memory cell array and disconnected when the corresponding memory cell array is defective. As a result, the cache memory device can indicate that, when a bit line of a certain memory cell array is defective, the memory cell array is defective by disconnecting a second fuse element corresponding to the memory cell array.

8 Claims, 9 Drawing Sheets

SEMICONDUCTOR MEMORY DEVICE WHICH CAN BE PROGRAMMED TO INDICATE DEFECTIVE MEMORY CELL

BACKGROUND OF THE INVENTION

1. Field of the Invention

The present invention generally relates to semiconductor memory devices, and more particularly, to a cache memory used in all levels of computers, such as a super computer, a large size computer, a work station, and a personal computer, in order to increase the operation speed, and in particularly, to shorten a read time or write time of a memory.

2. Description of the Background Art

FIG. 5 is a block diagram showing a logical configuration of a conventional cache memory, which is a direct map configuration having the number of ways reduced from 2 to 1 for description of a cache memory of VAX-11/780 introduced in FIG. 8. 11 of "COMPUTER ARCHITECTURE A QUANTITATIVE APPROACH" written by John L. Hennessy and David A. Patterson, published from Morgan Kaufmann Publishers Inc., for example.

Referring to FIG. 5, the cache memory includes a static memory region 1 and a comparison logic circuit 7. Memory region 1 includes a plurality of (for example, 512) entries 2. Each entry 2 includes a data memory region 3 storing data (for example, 64 bits) of a main memory device, not shown, a tag memory region 4 storing upper bits (for example, 20 bits, which is referred to as tag data) of an address of the data stored in data memory region 3 in the main memory device, and a status valid bit region 5 storing status valid data (for example, one bit) indicating whether or not data stored in data memory region 3 and tag memory region 4 are valid or not.

On the other hand, an address bit train 10 externally applied to the cache memory includes an uppermost tag portion 11 (20 bits in this case), an intermediate index portion 12 (nine bits in this case) and a lowermost block offset portion 13 (for example, three bits) corresponding to the cache memory configuration. Data to be accessed is uniquely positioned by index portion 12. In other words, 9-bit index portion 12 corresponds to 512 entries 2.

Upon external application of address bit train 10, a bit train of index portion 12 included therein is decoded, and one of 512 entries 2 is selected. Then, data of data memory region 3, tag data of tag memory region 4, and status valid data of status valid bit region 5, of selected entry 2 are read out. Comparison logic circuit 7 compares the read tag data with a tag portion 11 of address bit train 10. When the tag data and tag portion 11 match, and the read status valid data is valid, comparison logic circuit 7 provides a hit signal HIT outside, and indicates that the data provided outside is correct. When the read status valid data is invalid, comparison logic circuit 7 provides a miss signal MISS outside, and indicates that the data provided outside is invalid.

Memory region 1 of the cache memory shown in FIG. 5 is actually configured of a plurality of memory cell arrays 14 disposed in the Y direction as shown in FIG. 7. FIG. 6 is a block diagram showing a specific configuration of one memory cell array 14. Referring to FIG. 6, memory cell array 14 includes a plurality of static memory cells 15 disposed in a matrix in X and Y directions, a plurality of word lines 16 connected to memory cell rows 15x (each including a plurality of static memory cells 15 disposed in line in the X direction), a word line peripheral circuit 17 including a row decoder and the like, a plurality of bit line pairs 18, 18 each connected to memory cell columns 15y (each including a plurality of memory cells 15 disposed in line in the Y direction), and a bit line peripheral circuit 19 including a column decoder and the like. Memory cell 15 stores one-bit information. Each memory cell row 15x configures one entry 2. In response to external designation of memory cell row 15x (entry 2), word line peripheral circuit 17 selects one of word lines 16. All the memory cells 15 connected to selected word line 16 are activated, and data can be read out/written from/to memory cells 15. Bit line peripheral circuit 19 reads out/write data from/to activated memory cells 15 through bit line 18.

Memory region 1 is configured of a plurality of memory cell arrays 14, because configuration of memory region 1 of one memory cell array 14 makes word lines 16 and bit lines 18 longer, resulting in decreased operation speed at reading/writing, and increased power consumption.

x in memory region 1 of FIG. 5 indicates defective memory cell 15. x at A in the figure indicates the case where only one memory cell 15 is defective. In this case, only one bit of one entry 2 becomes defective. x at B in the figure indicates the case where a defect occurs in one word line 16, that is, the case where word line 16 is disconnected, or shorted to a power supply level. In this case, a part or all of the bits of one entry 2 become defective. x at C in the figure shows the case where a defect occurs in one bit line 18, that is, the case where bit line 18 is disconnected or shorted to a power supply level. In this case, all the entries 2 connected to one bit line 18 become defective.

Since the conventional cache memory is configured as described above, all the memory cells 15 configuring memory region 1 must operate normally. Even if one memory cell 15 is defective, the cache memory does not operate normally. Therefore, yield in production of a cache memory of a large capacitance was low.

In order to solve such a problem, a memory circuit is provided for discriminating defective entry 2 including a defective bit, so that defective entry 2 is not used, and that only non-defective entry 2 is used. This is disclosed in Japanese Patent Laying-Open No. 4-175945, and in pages 50 and 51 of ISSCC Digest of Technical Papers 1986. FIG. 8 is a block diagram showing a logical configuration of a cache memory thus improved. The cache memory includes a hardware valid bit region 6 for discriminating defective entry 2 provided in each entry 2. Hardware valid bit region 6 of defective entry 2 including a defective bit shown by x is set to an invalid state ("I" in the figure), and hardware valid bit region 6 of non-defective entry 2 is set to a valid state ("V" in the figure).

Upon external application of address bit train 10, one entry 2 corresponding to index portion 7 included therein is selected. Similar to the case of the cache memory shown in FIG. 5, data, tag data and status valid data are read out from data memory region 3, tag memory region 4, and status valid bit region 5, respectively, of selected entry 2. Hardware valid data is simultaneously read out from hardware valid bit region 6.

When the read hardware valid data is in a valid state, the read tag data and tag portion 11 of address bit train 10 are compared in comparison logic circuit 7. When the tag data and tag portion 11 match, and the read status valid data is in a valid state, hit signal HIT indicating that the read data is desired one is provided outside from comparison logic circuit 7.

When the read hardware valid data is in an invalid state, comparison logic circuit 7 provides outside a signal indicating that the accessed data is invalid. To do so, when the hardware valid data is in an invalid state, miss signal MISS indicating that the read data is invalid may be provided by comparison logic circuit 7 irrespective of the comparison result of the tag data with data portion 11 and the status valid data. The hardware valid data may be provided outside to be subjected to external processing.

FIG. 9 is a circuit diagram of a conventional program circuit 400 actually configuring hardware valid bit region 6. Program circuit 400 includes N channel MOS transistors 22 of the same number as that of entries 2 and program fuses 23 connected in series with transistors 22, and a precharge circuit 25. N channel MOS transistor 22 has its source connected to a ground node, its drain connected to one terminal of program fuse 23, and its gate connected to each entry select line 21. The other terminal of program fuse 23 is connected to the output of precharge circuit 25 through a signal line 24. When entry 2 includes a defective bit, program fuse 23 corresponding to the entry 2 is disconnected. As a result, hardware valid bit region 6 of the entry 2 is set to an invalid state.

Operation will now be described. The potential of signal line 24 is set to a logical high or H level by precharge circuit 25 prior to selection of entry 2. When one entry 2 is selected (when the potential of entry select line 21 attains an H level), N channel MOS transistor 22 for the entry 2 is brought to an on state. When the entry 2 is non-defective, and program fuse 23 for the entry 2 is not disconnected, signal line 24 is conducted to the ground terminal through program fuse 23 and N channel MOS transistor 22, and the potential of signal line 24 attains a logical low or L level. On the other hand, when entry 2 is defective, and program fuse 23 for the entry 2 is disconnected, the potential of signal line 24 is maintained at an H level. Therefore, after selection of entry 2, when the potential of signal line 24 is at an L level, it is determined that entry 2 is in a valid state, and when the potential of signal line 24 is at an H level, it is determined that entry 2 is in an invalid state.

In such a cache memory, when only one memory cell 15 is defective as shown by x at A, and when a defect occurs in one word line as shown by x at B, only one program fuse 23 for entry 2 including the defect may be disconnected. However, when a defect occurs in bit line 18 as shown by x at C, a number of continuous program fuses 23 must be disconnected. Therefore, it took a longer time to disconnect program fuses 23, and it was difficult to reliably disconnect program fuses 23.

SUMMARY OF THE INVENTION

One object of the present invention is to provide a semiconductor memory device which can be programmed to indicate whether a memory cell row is defective or not in a short time.

Another object of the present invention is to provide a semiconductor memory device which can reliably be programmed to indicate whether a memory cell row is defective or not.

Still another object of the present invention is to improve yield in production of a semiconductor memory device.

A further object of the present invention is to provide a semiconductor memory device which can be programmed to indicate that, when a bit line is defective, a memory cell array including the defective bit line is defective, by disconnecting one fuse element.

A semiconductor device according to one aspect of the present invention includes a plurality of memory cell arrays, a plurality of first program elements, and a plurality of second program elements. Each of the plurality of memory cell arrays includes a plurality of memory cell rows. Each of the plurality of memory cell rows includes a plurality of memory cells. Each of the plurality of first program elements, provided corresponding to a memory cell row, is programmed to indicate whether the corresponding memory cell row is defective or not. Each of the plurality of second program elements, provided corresponding to a memory cell array, is programmed to indicate whether the corresponding memory cell array is defective or not.

A semiconductor memory device according to another aspect of the present invention includes a plurality of memory cell groups, a plurality of first program elements, a plurality of second program elements, and a plurality of third program elements. Each of the plurality of memory cell groups includes a plurality of memory cell arrays. Each of the plurality of memory cell arrays includes a plurality of memory cell rows. Each of the plurality of memory cell rows includes a plurality of memory cells. Each of the plurality of first program elements, provided corresponding to a memory cell row, is programmed to indicate whether the corresponding memory cell row is defective or not. Each of the plurality of second program elements, provided corresponding to each memory cell array, is programmed to indicate whether the corresponding memory cell array is defective or not. Each of the plurality of third program elements, provided corresponding to a memory cell group, is programmed to indicate whether the corresponding memory cell group is defective or not.

According to the present invention, second program elements are provided corresponding to memory cell arrays. When a certain memory cell array is defective, a second program element corresponding to the memory cell array has only to be programmed to indicate that the memory cell array is defective. Therefore, a main advantage of the present invention is that a semiconductor memory device can indicate whether a memory cell row is defective or not in a short time.

According to the present invention, third program elements are provided corresponding to memory cell groups. When a certain memory cell group is defective, a third program element corresponding to the memory cell group has only to be programmed to indicate that the memory cell group is defective. Therefore, another advantage of the present invention is that a semiconductor memory device can indicate whether a memory cell row is defective or not in a shorter time.

The foregoing and other objects, features, aspects and advantages of the present invention will become more apparent from the following detailed description of the present invention when taken in conjunction accompanying drawings.

DESCRIPTION OF THE PREFERRED EMBODIMENTS

[Embodiment 1]

Figure 1:
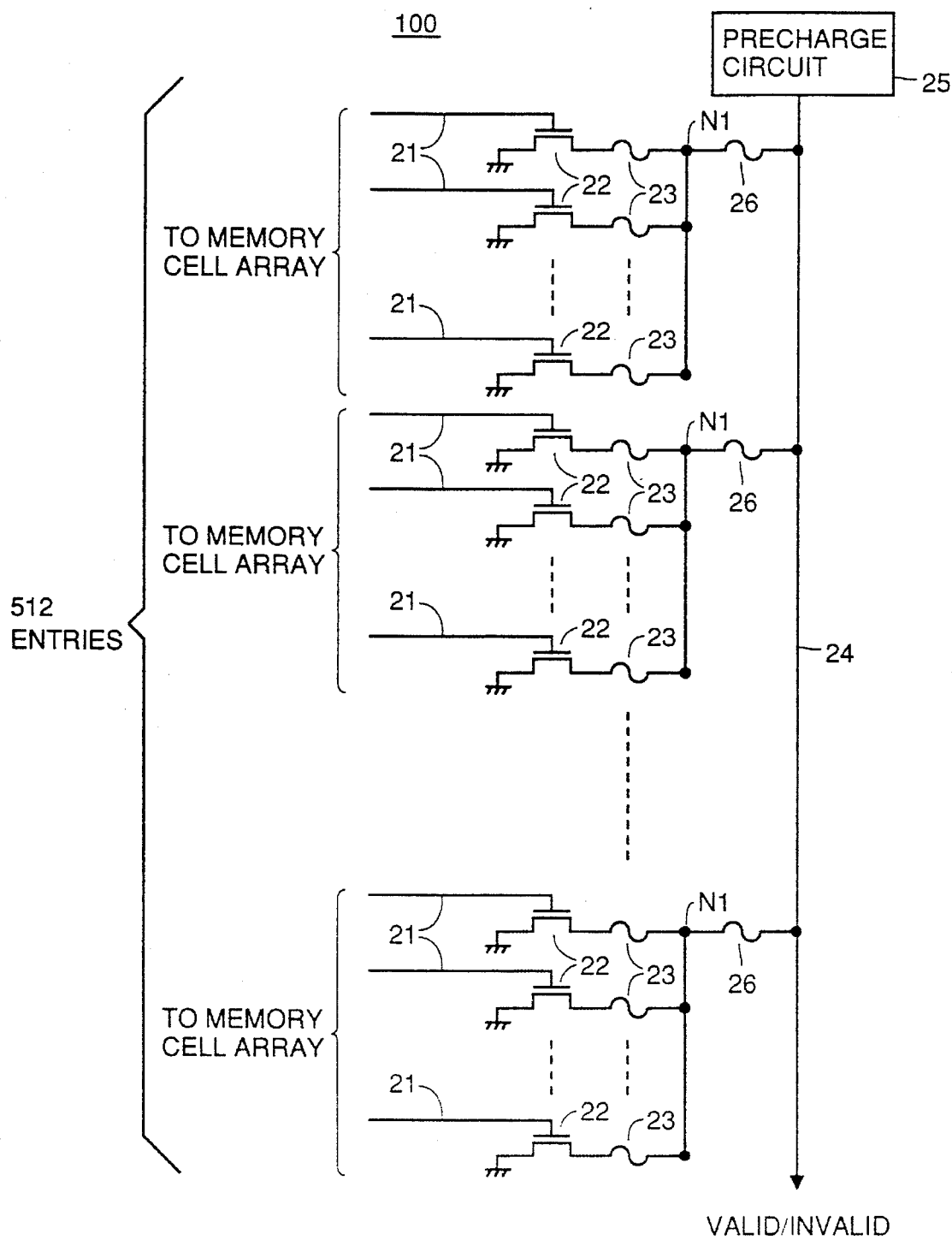
FIG. 1 is a circuit diagram of a program circuit of a cache memory according to Embodiment 1 of the present invention.

Description will be given of a cache memory according to Embodiment 1 of the present invention hereinafter. Since the logical configuration of the cache memory of Embodiment 1 is similar to that shown in FIG. 8, the description will not be repeated. FIG. 1 is a circuit diagram of a program circuit 100 configuring hardware valid bit region 6 of the cache memory of Embodiment 1. Compared to conventional program circuit 400 shown in FIG. 9, program circuit 100 further includes program fuses 26 to be programmed to indicate whether memory cell arrays 14 are defective or not. More specifically, one terminals of a plurality of program fuses 23 for entries 2 included in one memory cell array 14 are connected to one node N1, and program fuse 26 is connected between node N1 and signal line 24.

Figure 6:
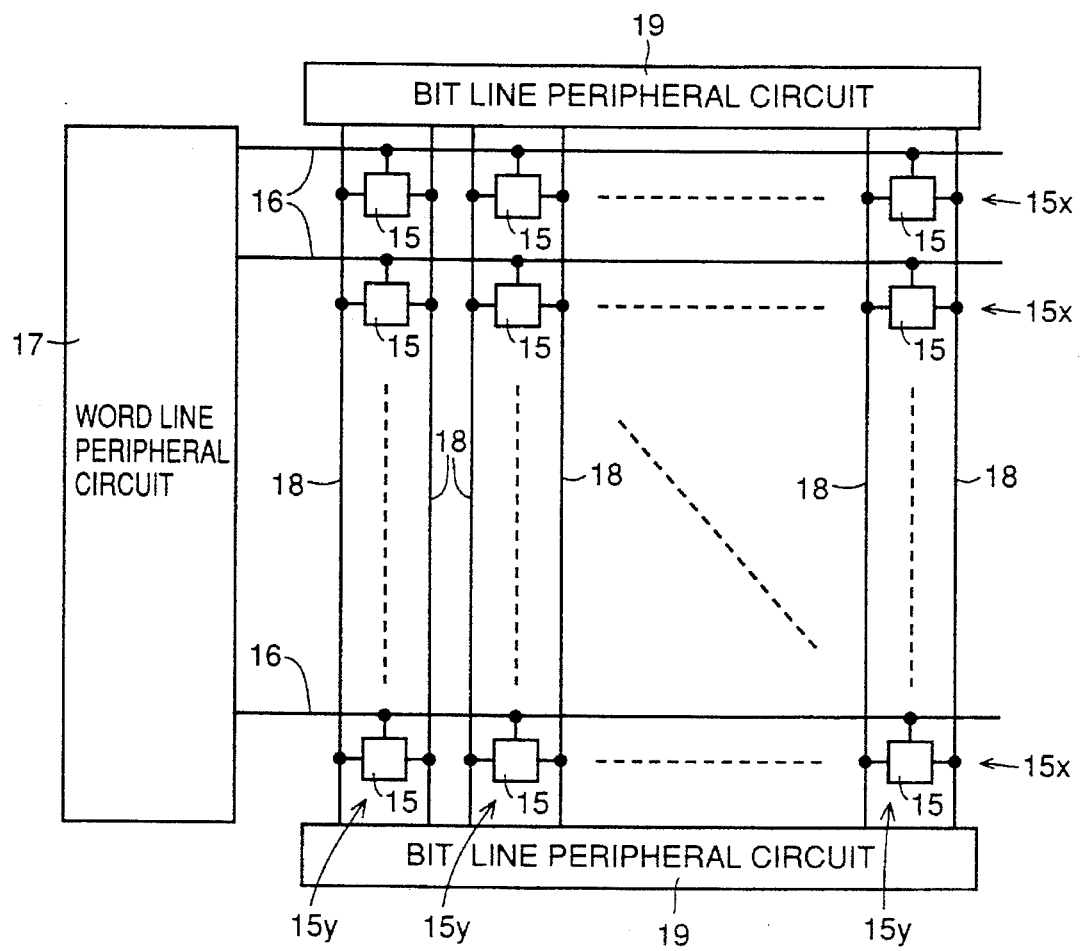
FIG. 6 is a block diagram showing the entire configuration of one memory cell array configuring a memory region of a cache memory.
Figure 7:
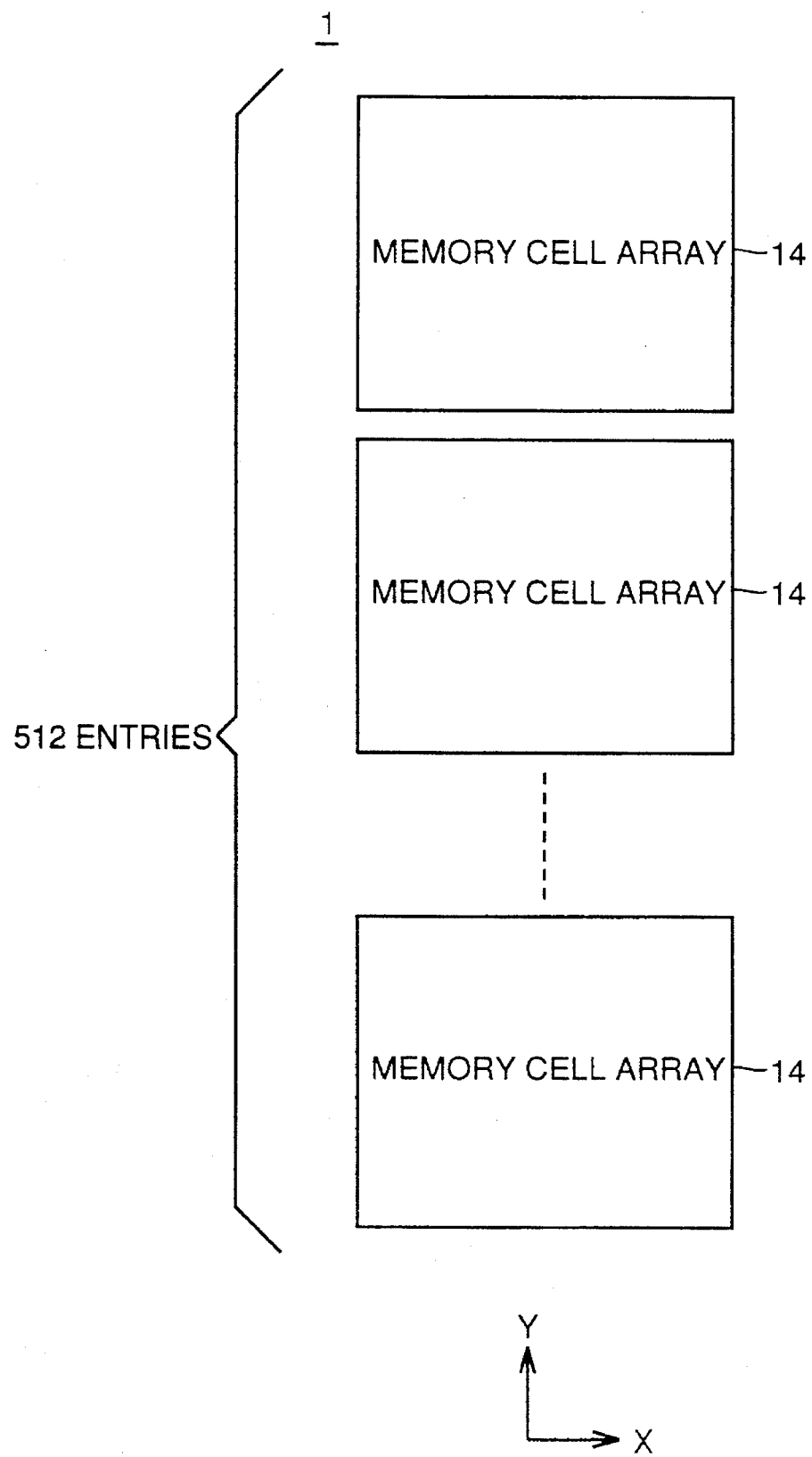
FIG. 7 is a block diagram showing all the memory cell arrays configuring a memory region of a cache memory.
Figure 8:
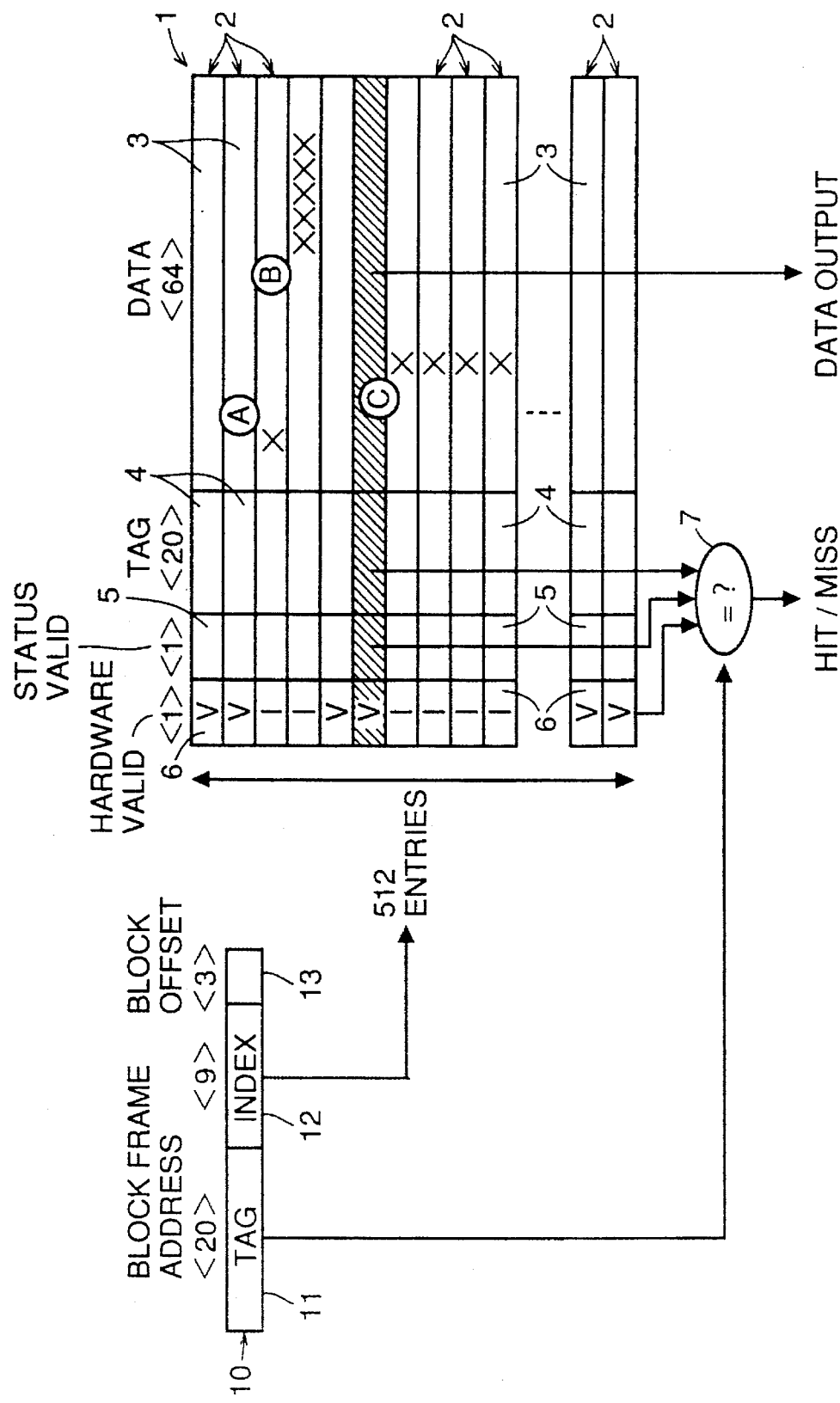
FIG. 8 is a block diagram showing a logical configuration of a cache memory.

Therefore, the cache memory according to Embodiment 1 includes a plurality of memory cell arrays 14, as shown in FIG. 7. The specific configuration of each memory cell array 14 is shown in FIG. 6. Referring to FIGS. 1, 6 and 8, the cache memory includes 512 entries 2. Each entry 2 corresponds to memory cell row 15x including a plurality of memory cells 15. Each of N channel MOS transistors 22 is provided corresponding to each memory cell row 15x. Each of program fuses 23 is also provided corresponding to each memory cell row 15x. Each of program fuses 26 is provided corresponding to each memory cell array 14.

In program circuit 100, when a defect occurs in one memory cell 15, or when a defect occurs in one word line, fuse 23 for entry 2 including the defect is disconnected. When a defect occurs in bit line 18, program fuse 26 for memory cell array 14 including the bit line 18 is disconnected.

Operation will now be described. The potential of signal line 24 is set to an H level by precharge circuit 25 prior to selection of entry 2. When entry 2 is selected (when entry select line 21 attains an H level), N channel MOS transistor 22 for the entry 2 is brought to an on state. When all the memory cell arrays 14 are non-defective, and program fuse 26 is not disconnected, signal line 24 is conducted to the ground terminal through program fuses 26, 23 and N channel MOS transistors 22, whereby the potential of signal line 24 attains an L level.

On the other hand, when memory cell array 14 is defective, and program fuse 26 for the memory cell array 14 is disconnected signal line 24 is not conducted to the ground terminal even if entry 2 configured of memory cell rows 15x of the memory cell array 14 is selected. The potential of signal line 24 is maintained at an H level.

Figure 9:
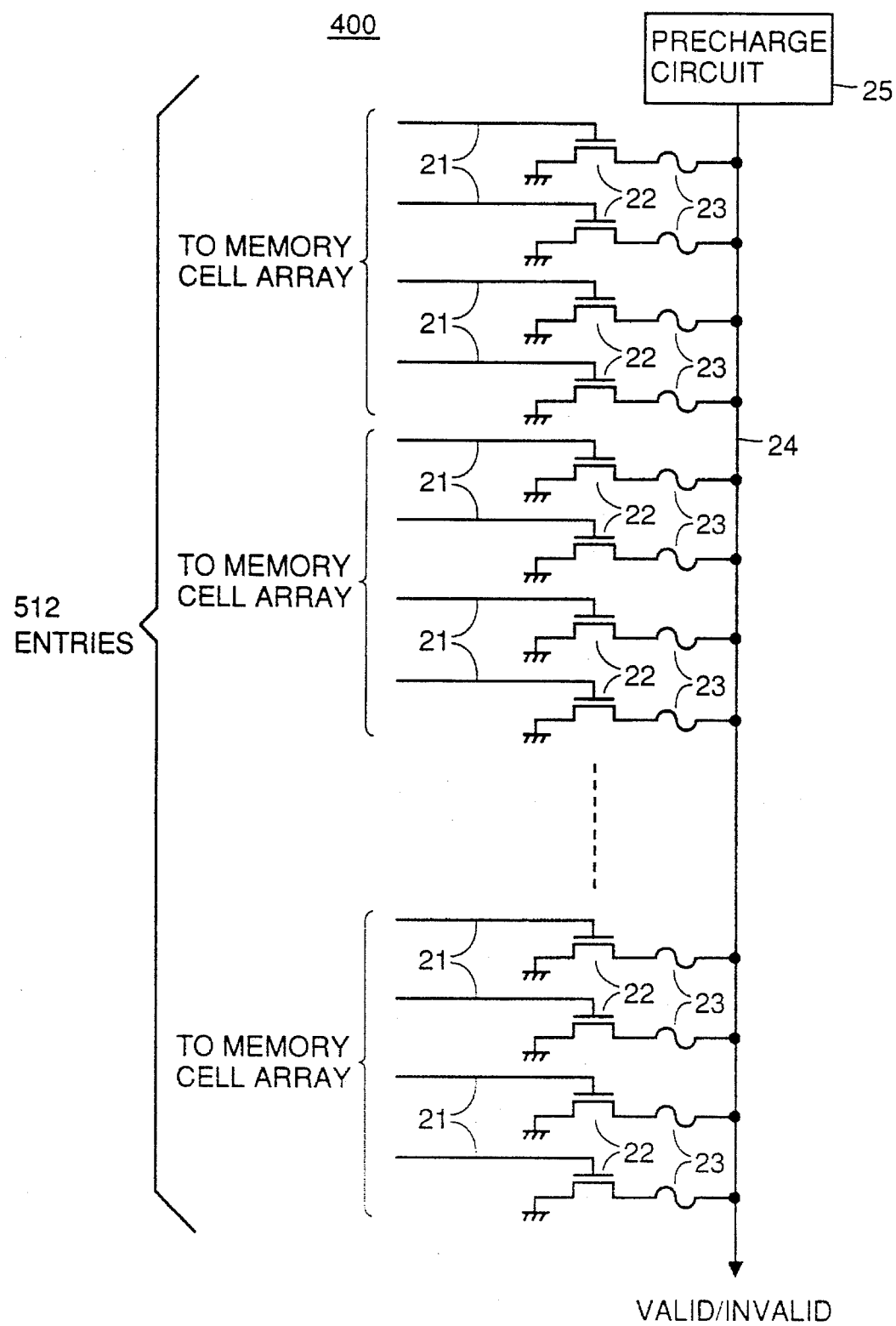
FIG. 9 is a circuit diagram of a conventional program circuit of a cache memory.

When a defect occurs in only one memory cell row 15x, program circuit 100 operates similar to program circuit 400 shown in FIG. 9. The description thereof will not be repeated.

Therefore, after entry 2 is selected, when the potential of signal line 24 is at an L level, it is determined that entry 2 is in a valid state, and when the potential of signal 24 is at an H level, it is determined that entry 2 is in an invalid state.

In Embodiment 1, program fuse 26 to be programmed to indicate whether memory cell array 14 is defective or not is provided. Therefore, even if the entire memory cell array 14 is defective because of a defective bit line, only one program fuse 26 has to be disconnected. It is not necessary to disconnect a plurality of program fuses 23, unlike the conventional case. Therefore, the semiconductor memory device can reliably indicate whether a memory cell row is defective or not in a short time.

[Embodiment 2]

Figure 2:
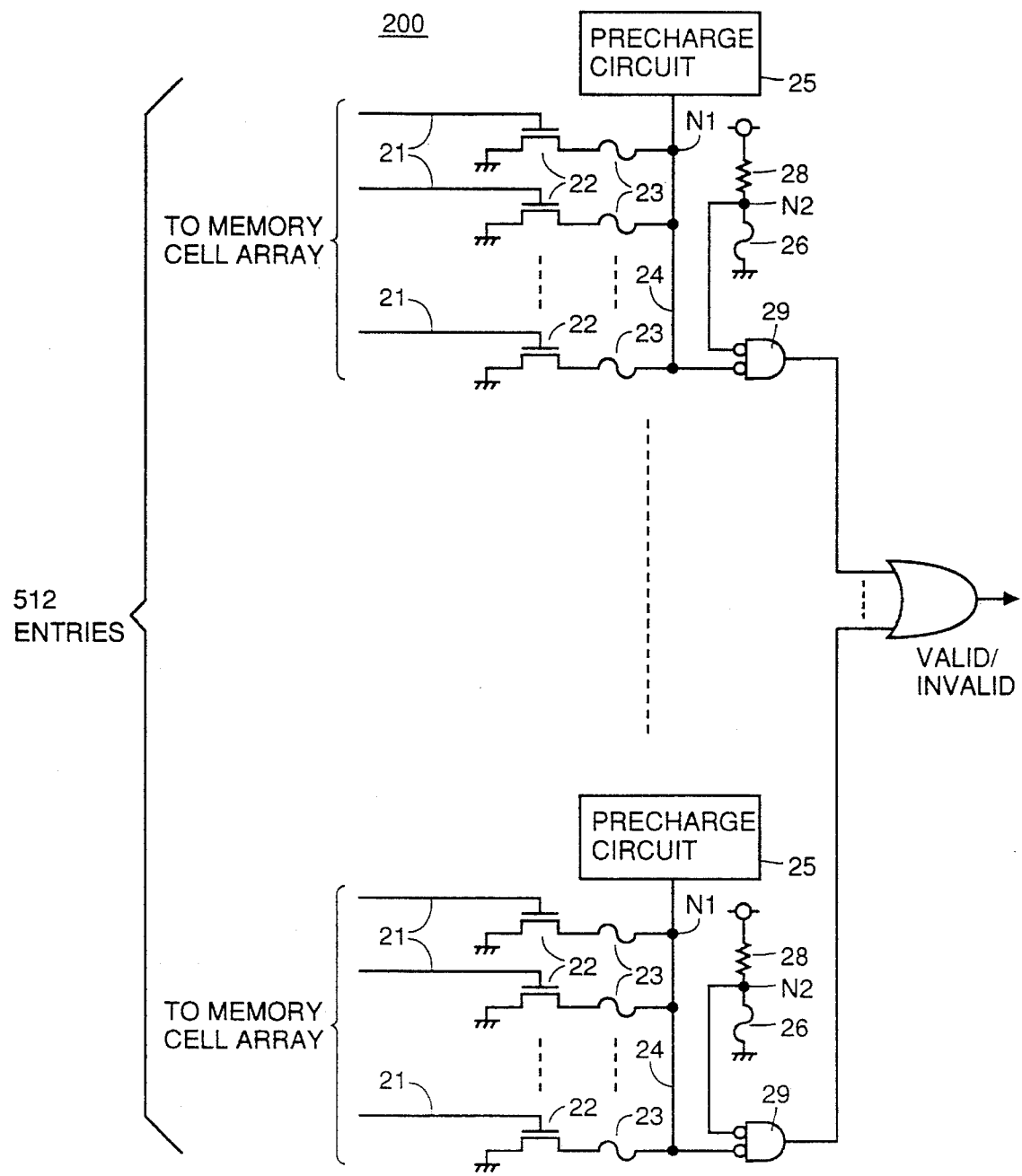
FIG. 2 is a circuit diagram of a program circuit of a cache memory according to Embodiment 2 of the present invention.

FIG. 2 is a circuit diagram of a program circuit 200 configuring hardware valid bit region 6 of a cache memory according to Embodiment 2 of the present invention. Program circuit 200 includes N channel MOS transistors 22 of the same number as that of entries 2 and program fuses 23 connected in series with N channel MOS transistors 22, precharge circuits 25, current limit resistances 28, program fuses 26 and NOR gates 29 of the same number as that of memory cell arrays 14, and an OR gate 30.

Similar to the case of conventional program circuit 400, N channel MOS transistor 22 has its source connected to the ground node, and its gate connected to each entry select line 21. The other terminals of a plurality of program fuses 23 for entry 2 included in one memory cell array 14 are connected in common by one signal line 24. Each signal line 24 is connected to the output of corresponding precharge circuit 25 through node N1. Each current limit resistance 28 is connected between a power supply node and anode N2, and each program fuse 26 is connected between node N2 and the ground node. NOR gate 29 receives a potential level of node N1, and a potential level of N2. OR gate 30 receives the output of each NOR gate 29. When the output of OR gate 30 is at an H level, it is determined that the selected entry 2 is valid. When the output of OR gate 30 is at an L level, it is determined that the selected entry 2 is invalid.

In program circuit 200, when entry 2 is defective, program fuse 23 for the entry 2 is disconnected, similar to the case of program circuit 100 of FIG. 1. When memory cell array 14 is defective, program fuse 26 for the memory cell array 14 is disconnected.

Operation will now be described. Prior to selection of entry 2, the potential of each node N1 is set to an H level by precharge circuit 25. At this time, the output of NOR gate 29 is brought to an L level irrespective of the potential level of node N2. The output of OR gate 30 is also brought to an L level (invalid state).

When entry 2 having program fuse 23 disconnected is selected, the potential of node N1 is maintained at an H level. The output of OR gate 30 is also maintained at an L level (invalid state).

On the other hand, when entry 2 corresponding to disconnected program fuse 23 is selected, the potential of node N1 attains an L level. The output of NOR gate 29 attains a level which is an inversion of the potential level of node N2. When program fuse 26 for memory cell array 14 is disconnected, the potential of node N2 is at an H level. The output of NOR gate 29 attains an L level, which is an inversion of the potential level of node N2. Therefore, the output of OR gate 30 is maintained at an L level (invalid state). When program fuse 26 for memory cell array 14 is not disconnected, the potential level of node N2 is at an L level. The output of NOR gate 29 attains an H level, which is an inversion of the potential level of node N2. Therefore, the output of OR gate 30 attains an H level (valid state).

In Embodiment 2, the similar effects as those of the program circuit shown in FIG. 1 can be obtained.

[Embodiment 3]

Figure 3:
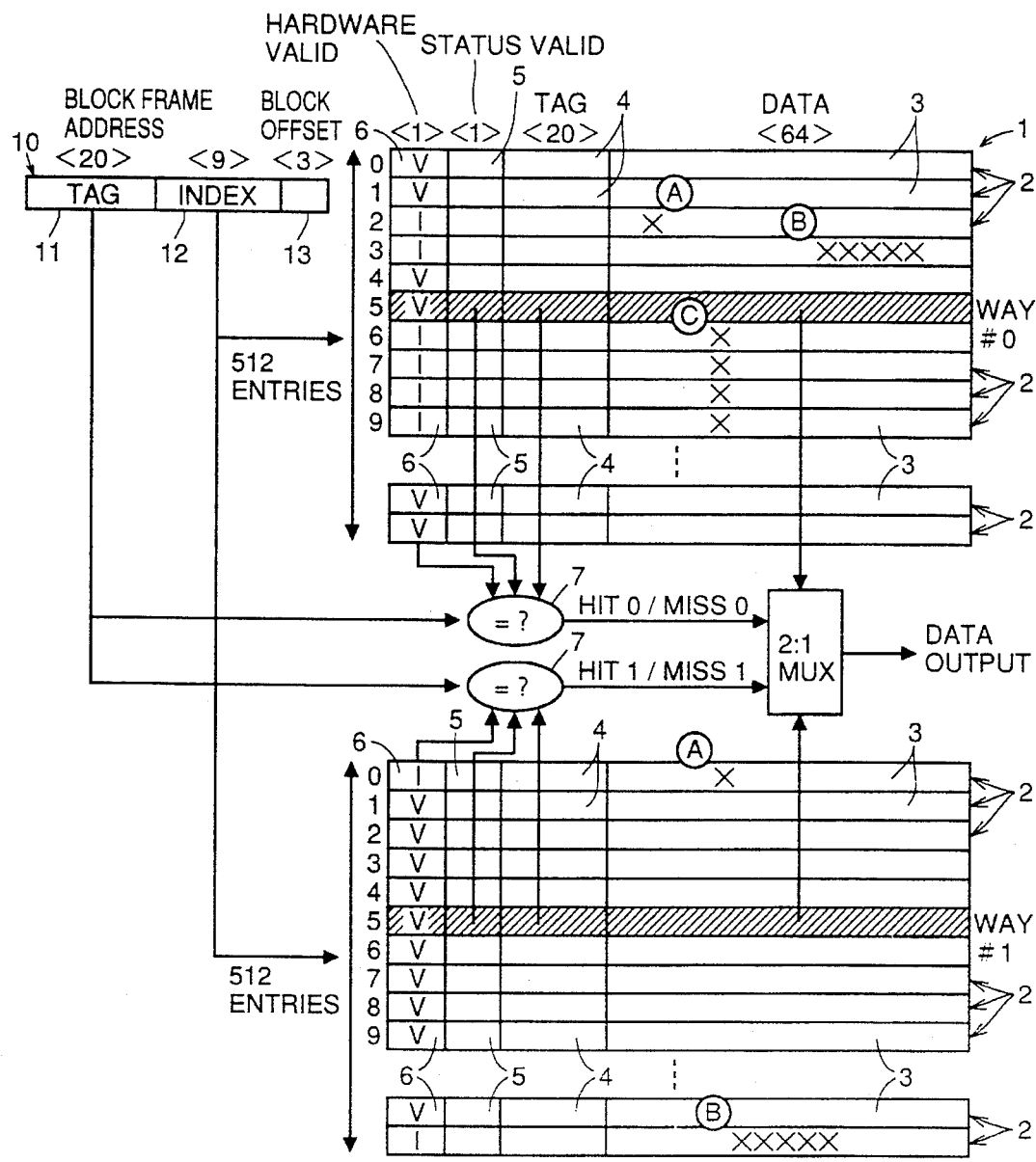
FIG. 3 is a block diagram showing a logical configuration of a cache memory according to Embodiment 3 of the present invention.

FIG. 3 is a block diagram showing a logical configuration of a cache memory according to Embodiment 3 of the present invention. This cache memory is a 2-way set associative cache memory, in which the number of ways is two. The cache memory includes two memory regions 1 and two comparison logic circuits 7 corresponding to two ways #0, #1, and a 2 to 1 multiplexer 8.

Upon external application of address bit train 10, a bit train of index portion 12 included in address bit train 10 is decoded, and one entry 2 is selected in respective ways #0, #1. Hardware valid data, status valid data and tag data of the selected entry 2 are applied to comparison logic circuit 7. Data is applied to multiplexer 8. According to a comparison result of the hardware valid data, the status valid data and the tag data with a tag portion of address bit train 10, comparison logic circuit 7 provides hit signals HIT0, HIT1 or miss signals MISS0, MISS1 to multiplexer 8. In response to hit signals HIT0, HIT1 or miss signal MISS0, MISS1 applied from comparison logic circuit 7, multiplexer 8 provides one of data read out from two ways #0 and #1 outside.

Figure 4:
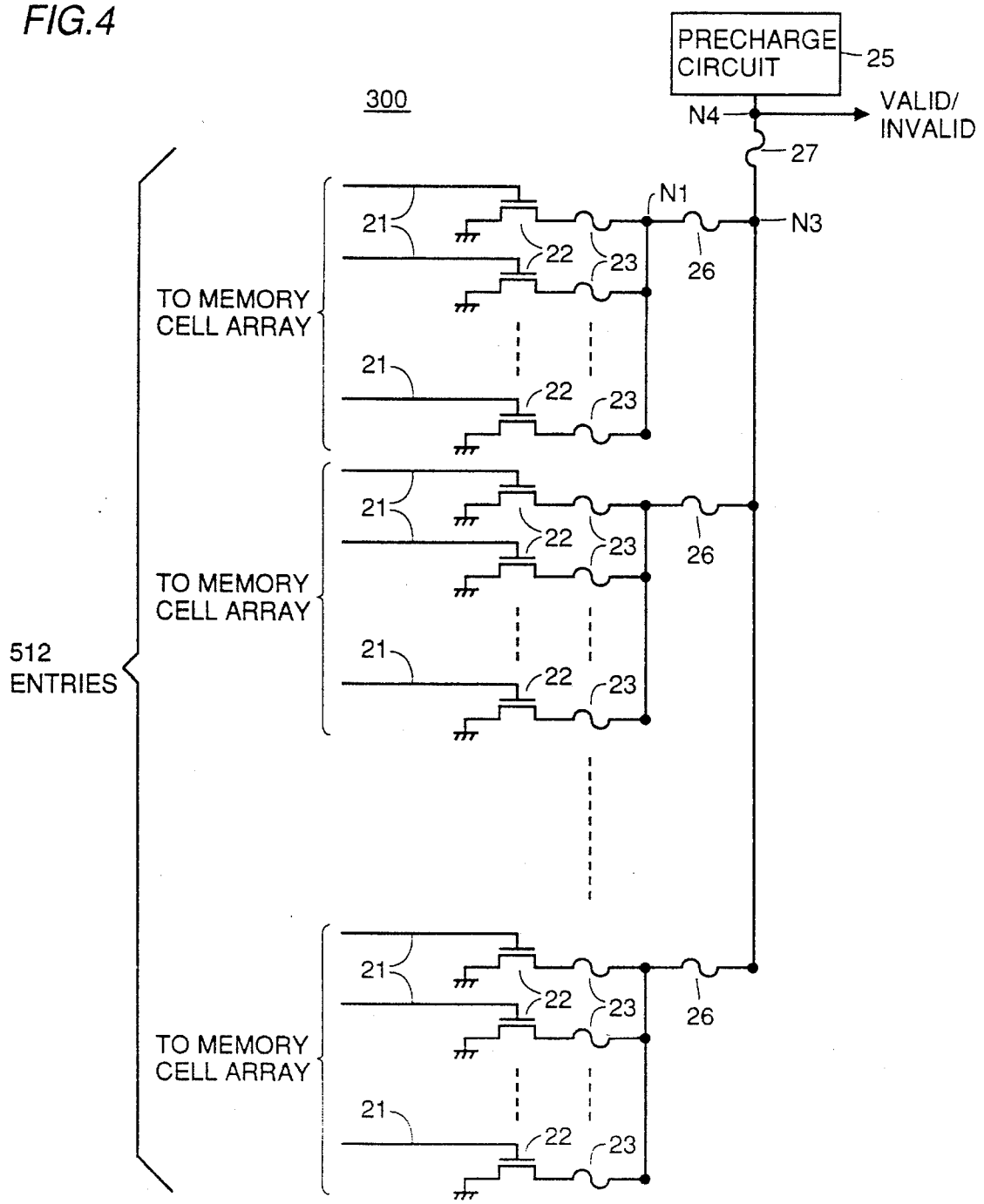
FIG. 4 is a circuit diagram of the program circuit of the cache memory shown in FIG. 3.
Figure 5:
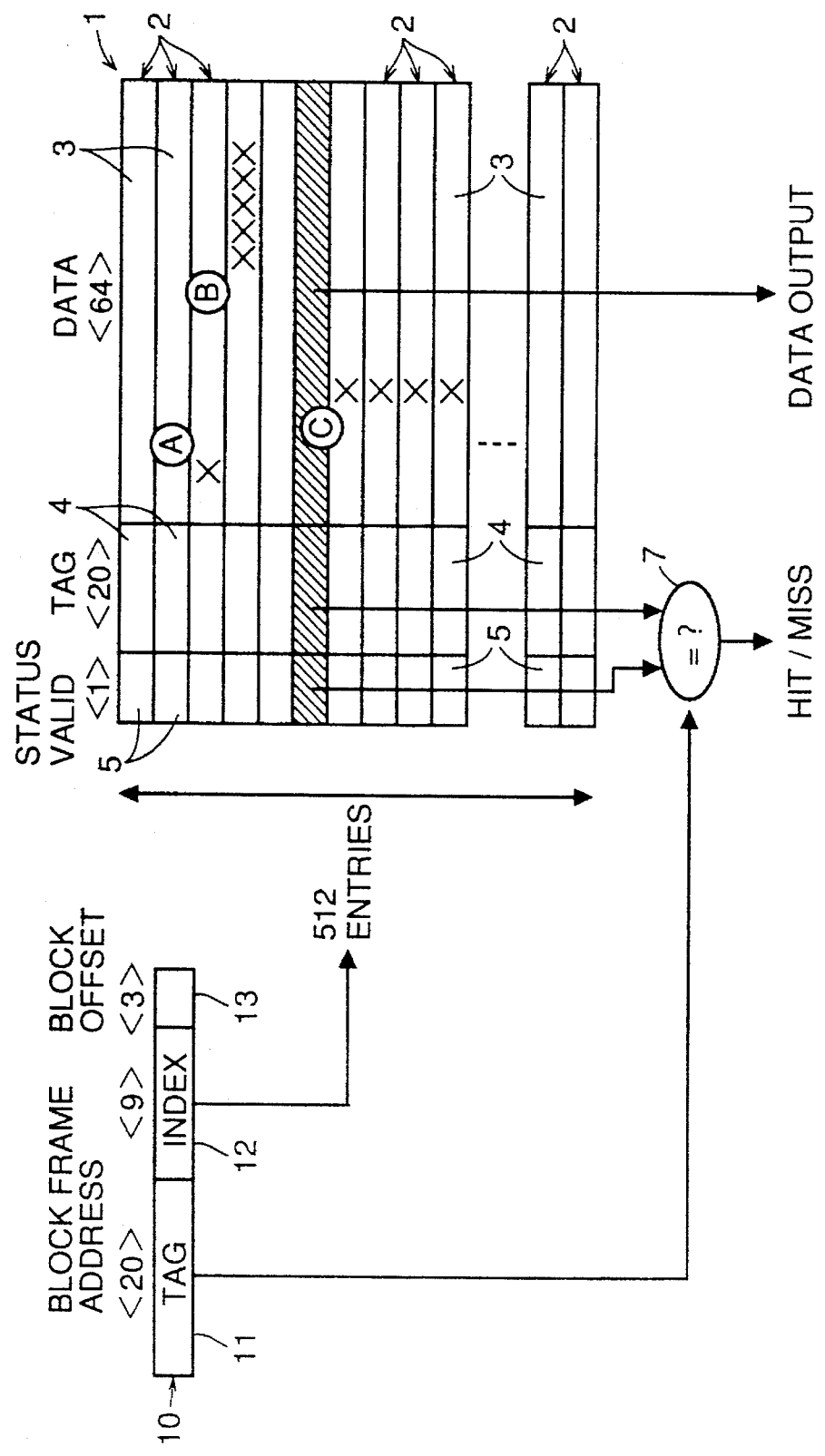
FIG. 5 is a block diagram showing a logical configuration of a conventional cache memory.

FIG. 4 is a circuit diagram of a program circuit 300 configuring hardware valid bit region 6 in memory region 1 of each of ways #0 and #1. Compared to program circuit 100 shown in FIG. 1, program circuit 300 is additionally provided with a program fuse 27 making all the entries 2 of one way invalid. More specifically, in program circuit 300, the other terminal of program fuse 26 programmed to indicate whether each memory cell array 14 is defective or not is connected to one node N3. Node N3 is connected to precharge circuit 25 through program fuse 27 and node 4. When the potential level of node N4 is at an H level, it is determined that the selected entry 2 is invalid. When the potential level of node N4 is at an L level, it is determined that the selected entry 2 is valid.

In Embodiment 3, each of N channel MOS transistors 22 is provided corresponding to each memory cell row 15x of FIG. 6. Each of program fuses 23 is also provided corresponding to each memory cell row 15x of FIG. 6. Each of program fuses 26 is provided corresponding to each memory cell array 14. Program fuse 27 is provided corresponding to way #0 or #1.

When entry 2 is defective, program fuse 23 for the entry 2 is disconnected. When memory cell array 14 is defective, program fuse 26 for the memory cell array 14 is disconnected. When way #0 or #1 is defective, program fuse 27 for way #0 or #1 is disconnected. In operation, the potential of node N4 is set to an H level (invalid state) by precharge circuit 25, prior to selection of entry 2. When program fuse 27 is disconnected, the potential of node N4 is maintained at an H level (invalid state) irrespective of conduction of N channel MOS transistor 22 for the selected entry 2. When program fuse 27 is not disconnected, the operation is similar to that of program circuit 100 shown in FIG. 1. Therefore, the description will not be repeated.

In Embodiment 3, all the entries 2 of one way can be made invalid by disconnecting only one program fuse 27.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A cache memory device for increasing the operating speed of a cache memory comprising:

a plurality of cache memory cell arrays each including a plurality of memory cell rows, each of said plurality of memory cell rows including a plurality of memory cells;

a plurality of first programming means each provided corresponding to a memory cell row and programmed to indicate whether the corresponding memory cell row is defective or not; and a plurality of second programming means each provided corresponding to a memory cell array and programmed to indicate whether the corresponding cache memory cell array is defective or not.

2. The cache memory device as recited in claim 1, further comprising means for generating a signal when one of said plurality of first and second programming means is programmed to indicate that the corresponding memory cell row or corresponding cache memory cell array is defective.

3. A cache memory device for increasing the operating speed of a cache memory comprising:

a plurality of cache memory cell groups each including a plurality of cache memory cell arrays, said plurality of cache memory cell arrays each including a plurality of memory cell rows, and said plurality of memory cell rows each including a plurality of memory cells;

a plurality of first programming means each provided corresponding to a memory cell row and programmed to indicate whether the corresponding memory cell row is defective or not;

a plurality of second programming means each provided corresponding to a cache memory cell array and programmed to indicate whether the corresponding cache memory cell array is defective or not; and a plurality of third programming means each provided corresponding to a cache memory cell group and programmed to indicate whether the corresponding cache memory cell group is defective or not.

4. The cache memory device as recited in claim 3, further comprising:

means for generating a signal when one of said plurality of first to third programming means is programmed to indicate that the corresponding memory cell row, corresponding cache memory cell array, or corresponding cache memory cell group is defective.

5. A cache memory device copying data stored in a main memory device and storing the copied data therein, comprising:

a plurality of cache memory cell arrays each including a plurality of memory cell rows, said plurality of memory cell rows each storing any of said copied data, an address of any of said copied data in said main memory device, and information indicating whether any of said copied data is valid or invalid;

a plurality of first programming means each provided corresponding to a memory cell row and programmed to indicate whether the corresponding memory cell row is defective or not; and a plurality of second programming means each provided corresponding to a cache memory cell array and programmed to indicate whether the corresponding cache memory cell array is defective or not.

6. A cache memory device copying data stored in a main memory device and storing the copied data therein, comprising:

a plurality of cache memory cell groups each including a plurality of cache memory cell arrays, said plurality of cache memory cell arrays each including a plurality of memory cell rows, and said plurality of memory cell rows each storing any of said copied data, an address of any of said copied data in said main memory device, and information indicating whether any of said copied data is valid or invalid;

a plurality of first programming means each provided corresponding to a memory cell row and programmed to indicate whether the corresponding memory cell row is defective or not;

a plurality of second programming means each provided corresponding to a cache memory cell array and programmed to indicate whether the corresponding cache memory cell array is defective or not; and a plurality of third programming means each provided corresponding to a cache memory cell group and programmed to indicate whether the corresponding cache memory cell group is defective or not.

7. A cache memory device for increasing the operating speed of a cache memory, comprising:

a plurality of cache memory cell arrays each including a plurality of memory cell rows and selecting means for selecting any of said plurality of memory cell rows, said plurality of memory cell rows each including a plurality of memory cells;

a plurality of first fuse elements each provided corresponding to a memory cell row and disconnected when a corresponding memory cell row is defective;

a plurality of second fuse elements each provided corresponding to a cache memory cell array and disconnected when the corresponding cache memory cell array is defective, and having one terminal connected to one terminal of first fuse elements corresponding to the corresponding cache memory cell array;

a plurality of switching elements each provided corresponding to a memory cell row, connected between the other terminal of a first fuse element corresponding to the corresponding memory cell row and a node to which a predetermined potential is applied, and turned on upon selection of the corresponding memory cell row by selecting means of the corresponding cache memory cell array;

a signal line connected to the other terminals of said plurality of second fuse elements; and charging means for charging said signal line prior to selection of any of the memory cell rows by said selecting means.

8. A semiconductor memory device, comprising:

a plurality of memory cell arrays each including a plurality of memory cell rows and selecting means for selecting any of said plurality of memory cell rows, said plurality of memory cell rows each including a plurality of memory cells;

a plurality of first fuse elements each provided corresponding to a memory cell row and disconnected when the corresponding memory cell row is defective;

a plurality of signal lines each provided corresponding to a memory cell array and connected to one terminals of first fuse elements corresponding to the corresponding memory cell array;

a plurality of charging means each provided corresponding to a signal line for charging the corresponding signal line before selection of any of the memory cell rows by said selecting means;

a plurality of switching means each provided corresponding to a memory cell row, connected between the other terminal of the first fuse element corresponding to the corresponding memory cell row and a node to which a first potential is applied, and turned on upon selection of the corresponding memory cell row by selecting means of the corresponding memory cell array;

a plurality of second fuse elements each provided corresponding to a memory cell array, disconnected when the corresponding memory cell array is defective, and having one terminal connected to a node to which a second potential is applied;

a plurality of resistance elements each provided corresponding to a second fuse element and connected between the other terminal of the corresponding second fuse element and a node to which a third potential is applied;

a plurality of first logic circuits each provided corresponding to a memory cell array and receiving a potential of the signal line corresponding to the corresponding memory cell array and a potential of the other terminal of a second fuse element corresponding to the corresponding memory cell array; and a second logic circuit receiving outputs of said plurality of first logic circuits.

* * * * *